United States Patent [19]

dePoorter et al.

[11] Patent Number: 4,558,448
[45] Date of Patent: Dec. 10, 1985

[54] SEMICONDUCTOR LASER WITH END ZONES FOR REDUCING NON-RADIATING RECOMBINATION

[75] Inventors: Johannes A. dePoorter; Peter J. deWaard; Rudolf P. Tijburg; Gerardus L. Dinghs, all of Eindhoven, Netherlands

[73] Assignee: U.S. Philips Corporation, New York, N.Y.

[21] Appl. No.: 412,052

[22] Filed: Aug. 27, 1982

[30] Foreign Application Priority Data

Sep. 2, 1981 [NL] Netherlands ..................... 8104068

[51] Int. Cl.[4] .............................................. H01S 3/19
[52] U.S. Cl. ...................................... 372/44; 372/46; 372/49; 357/17
[58] Field of Search ................... 372/44, 45, 46, 49, 372/33; 357/17

[56] References Cited

U.S. PATENT DOCUMENTS 3,838,359  9/1974  Hakki et al. ............................ 372/49
4,309,668  1/1982  Ueno et al. ............................. 372/46

FOREIGN PATENT DOCUMENTS 0031691  3/1977  Japan ..................................... 372/49

Primary Examiner—James W. Davie
Attorney, Agent, or Firm—Robert T. Mayer; Steven R. Biren

[57] ABSTRACT

A semiconductor laser having mirror faces serving as resonators, in which the active laser region includes end zones adjoining the mirror faces which have implanted ions, preferably protons, with associated crystal damage. The end zones have a length which is at least equal to the diffusion length of the recombining charge carriers in the end zones. As a result of the high recombination rate in the end zones substantially no non-radiating recombination occurs at the mirror faces, so that mirror erosion is avoided.

6 Claims, 13 Drawing Figures

SEMICONDUCTOR LASER WITH END ZONES FOR REDUCING NON-RADIATING RECOMBINATION

BACKGROUND OF THE INVENTION

The invention relates to a semiconductor laser having a semiconductor body comprising an active laser region having a p-n junction, in which the active region is present within a resonator which is formed by two mutually parallel reflecting non-oxidized mirror faces, in which contact members are present to apply current in the forward direction to the p-n junction to generate coherent electromagnetic radiation in the active region, and in which the active region comprises end zones adjoining the mirror faces so as to reduce non-radiating recombination near the mirror faces.

The invention relates in addition to a method of manufacturing the said semiconductor laser.

A semiconductor laser of the kind described is known from the article by Yonezu et al. in *Applied Physics Letters* 34 (1979) pp. 637–639.

In conventional semiconductor lasers in which the active region is present between reflecting surfaces of the crystal, also termed mirror faces, said mirror faces tend to erode in the long run under the influence of non-radiating recombination at or near the mirror faces. This tendency is particularly strong when the laser is operated in an atmosphere comprising water vapor, even when this is present only in a very small concentration (for example, $1:10^5$). This mirror erosion gives rise to a gradual degradation of the properties of the laser, inter alia to a continuous increase of the threshold current and to the occurrence of pulsations in the emitted radiation. See, for example, J. A. F. Peek in *Electronics Letters* Vol. 16 No. 11, May 22, 1980, pp. 441–442, H. Yonezu et al. in *Journal of Applied Physics*, 50(8), August, 1979, pp. 5150–5157, and F. R. Nash et al. in *Applied Physics Letters*, 35(12) Dec. 15, 1979, pp. 905–907. The cause of all this is that the reflecting properties of the mirror faces rapidly deteriorate as a result in an increase of the roughness of the said mirror faces.

Said erosion can be mitigated in various manners. For example, the water vapor can be eliminated, for example, by operating the laser in a vacuum. However, this necessitates a complicated and expensive encapsulation. The mirror faces may also be covered with a transparent dielectric protective layer. However, it is technologically difficult to provide a readily adhering protecting layer which is impervious to water vapor and has the correct thickness. A readily adhering and impervious protecting layer can be obtained inter alia by thermal oxidation of the mirror faces. However, this presents great problems in connection with the required high temperatures. Since the oxidation would have to be carried out after the metallization of the laser so that the oxide does not have to be removed for providing electrode layers, the oxidation temperature is restricted to that which the metallization can stand. Undesired impurities from the metallization may also enter the laser and the oxide. Furthermore, undesired diffusion within the laser structure may take place. The use of oxidized mirror faces is therefore to be discouraged.

From the publication JP-A53-61985 a method is known in which an improved thermal oxidation of the mirror faces is achieved by bombarding the mirror faces, prior to the oxidation, with ions, for example protons, so as to form an implanted layer having a thickness smaller than the internal laser wavelength. The above-mentioned disadvantages associated with thermal oxidation of the mirror faces are not obviated by this method.

It is also possible to provide dielectric protecting layers by sputtering or vapor deposition. However, in this manner also an efficacious protection of the mirror faces is technologically not easy to realize.

From the publication JP-A55-18078 a method is known in which on etched mesa mirror faces a dielectric layer is grown which is then bombarded with protons so as to improve the resistance against erosion. However, this method requires at least an extra etching step and the growth of a dielectric protective layer.

Another solution can be found by providing the active region with end zones which adjoin the mirror faces and have larger forbidden band gaps in which substantially no radiation absorption and consequently little non-radiating recombination occurs, as described in the above-mentioned article by Yonezu et al. in *Applied Physics Letters* 34 (1979) pp. 637–639. The selective zinc diffusion mentioned in this article, however, is complicated and not fully effective.

SUMMARY OF THE INVENTION

One of the objects of the invention is to provide a laser structure in which the effect of non-radiating recombination near the mirror faces is considerably reduced by using end zones of a new structure which are more effective and which can be formed in a simple and reproducible manner. Another object of the invention is to provide a method in which the end zones of a large number of semiconductor lasers can be formed simultaneously before removing the lasers from the common semiconductor wafer in which they are manufactured.

The invention is based inter alia on the recognition of the fact that these objects may be achieved by using end zones having a high recombination rate so that the non-radiating recombination no longer occurs in the immediate proximity of, but at some distance from, the mirror faces.

According to the invention a semiconductor laser of the kind described above is characterized in that the end zones are formed by parts of the active region which comprise implanted ions with associated crystal damage and extend from the mirror faces to a distance which is at least approximately equal to the diffusion length of recombining charge carriers in the end zones.

In the semiconductor laser structure according to the invention non-radiating recombination at the mirror faces is avoided because said recombination, as a result of the high recombination rate in the implanted end zones, takes place substantially entirely in parts of the end zones which are situated remote from the mirror faces. As a result of this, erosion of the mirror faces is avoided or at least is reduced considerably. Furthermore, providing end zones according to the invention involves fewer technological problems than the already mentioned diffusion techniques or the provision of protecting layers on the reflecting surfaces.

The implanted ions are preferably protons which, due to their small mass, reach the desired penetration depth with comparatively low energy. In certain circumstances, deuterons or singly ionized hydrogen molecules may also be implanted advantageously instead of protons. However, the invention is not restricted thereto since other ions with associated crystal damage might also be implanted, if desired, so as to obtain the desired effect.

If the end zones are formed by a proton bombardment, they preferably extend further than 0.5 μm and less than 5 μm from the mirror faces. It has been found that end zones having a larger length, for example of 10 μm, may have a detrimental influence on the laser properties while end zones having too small a length may not sufficiently prevent recombination at the mirror faces. As already said, the minimum length of the end zones is approximately equal to the diffusion length of the recombining charge carriers in the end zones.

The invention may be applied to any semiconductor laser having mirror faces in which non-radiating recombination can occur at or near said mirror faces. However, the invention may with particular advantage be used in semiconductor lasers having a layer structure in which the active region is strip-shaped and forms part of an active semiconductor layer extending parallel to a major surface of the semiconductor body, the p-n junction being parallel to said active layer. In lasers having this construction the ion bombardment which is required for the formation of the end zones may advantageously be combined with an ion bombardment, in particular a proton bombardment, which is used for defining the strip-shaped active region. According to a preferred embodiment said strip-shaped active region in its direction of width is bounded laterally by a part of an ion-implanted region which also forms the end zones. The strip-shaped active region, however, may also be bounded laterally in many other manners instead of by a proton bombardment. In this connection, many possibilities are known from the technical literature.

Semiconductor lasers in accordance with the invention can be formed very advantageously and efficiently by using a method in which in a semiconductor wafer having a layer structure suitable for the formation of semiconductor lasers and comprising at least an active semiconductor layer extending parallel to a major surface of the wafer, grooves which extend down to a smaller depth than the active layer are provided at the area where cleavage surfaces serving as mirror faces are to be provided, ions are implanted in the grooves, the implanted zones with associated crystal damage extending through the active layer, after which the semiconductor wafer is divided by breaking into separate lasers, thus forming the cleavage surfaces substantially normal to the active layer at the area of the grooves, so that the active layer of each laser obtains implanted end zones adjoining the cleavage surfaces.

By using this method a large number of lasers with bombarded end zones can be manufactured on one semiconductor wafer before severing the individual lasers by breaking.

BRIEF DESCRIPTION OF THE DRAWING

The invention will now be described in greater detail, by way of example, with reference to several embodiments and the drawing, in which.

The Figures are diagrammatic and not drawn to scale. In in particular the dimensions in the direction of thickness are exaggerated in the cross-sectional views.

DESCRIPTION OF THE PREFERRED EMBODIMENTS

Figure 1:
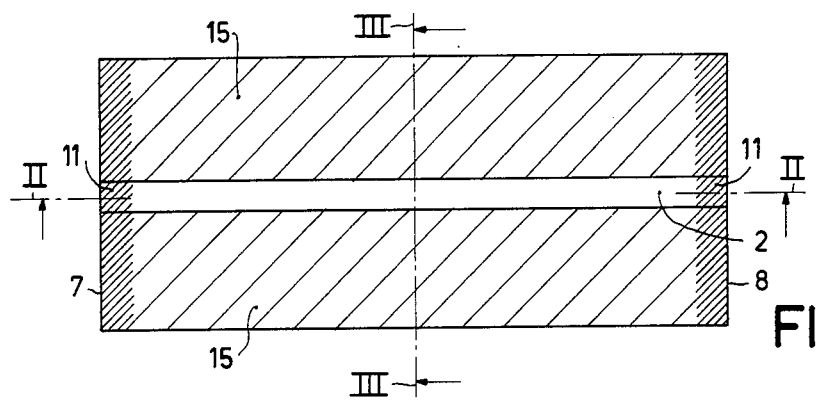
FIG. 1 is a plan view of a semiconductor laser according to the invention.
Figure 2:
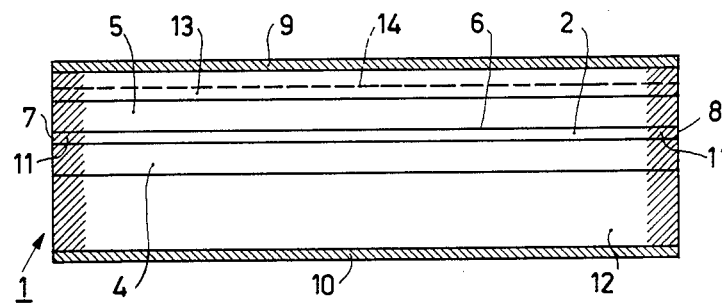
FIGS. 2 and 3 are diagrammatic cross-sectional views of the semiconductor laser shown in FIG. 1 taken on the lines II—II and III—III.
Figure 3:
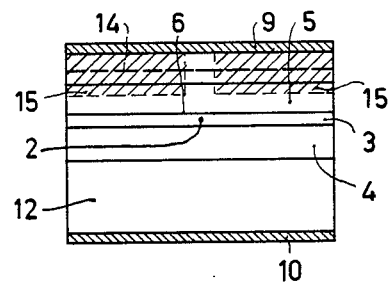

FIG. 1 is a plan view of a semiconductor laser according to the invention, and FIGS. 2 and 3 are cross-sectional views taken on the lines II—II and III—III, respectively, of FIG. 1. The semiconductor laser of this example is a laser of the double hetero junction type, although the invention also applies to p-n lasers having a different construction. The laser has a semiconductor body 1 with an active laser region 2 which in this example is strip-shaped and forms part of an active semiconductor layer 3 which extends parallel to a major surface of the semiconductor body and which is present between passive layers 4 and 5 which have a larger forbidden band gap than the active layer 3. The active laser region 2 comprises a p-n junction 6 which in this example is formed between the layers 3 and 5. However, in certain circumstances this p-n junction may be formed between the layers 3 and 4 or even within the layer 3 instead of between the layers 3 and 5.

The active region 2 is present within a resonator which is formed by two mutually parallel reflecting non-oxidized mirror faces, in this case the side facets 7 and 8 of the crystal. Furthermore, contact members are present in the form of two conductive electrode layers 9 and 10 with which current in the forward direction can be applied to the p-n junction 6 so as to generate coherent electromagnetic radiation in the active region 2 when the current rises above a given threshold value.

The active region 2 further comprises end zones 11, shaded in the drawing, which adjoin the mirror faces 7 and 8. These end zones 11 serve to reduce non-radiating recombinations in the immediate proximity of the mirror faces 7 and 8 in a manner to be described in detail hereinafter. As a result of such non-radiating recombinations, degradation of the reflecting properties of the mirror faces 7 and 8 may in fact occur.

According to the invention the end zones 11 are formed by parts of the active region 2 which comprise implanted ions with associated crystal damage, which parts extend from the mirror faces 7 and 8 up to a distance which is at least equal to the diffusion length of recombining charge carriers in the end zones. In this example the end zones comprise implanted protons and they extend up to approximately 1 μm from the mirror faces 7 and 8. This is more than the diffusion length of holes and electrons in the zones 11 which diffusion length is only a few tenths of a μm.

As a result of the high recombination rate in the end zones 11 the recombination of electron-hole pairs generated in said zones by the laser radiation takes place nearly immediately on entering the zones 11, and at some distance before the mirror faces 7 and 8. Consequently, at the area of said mirror faces substantially no recombination takes place, the mirror faces 7 and 8 conserve their good reflecting properties much longer than in known lasers. As a result of this the lifetime of the semiconductor laser according to the invention is considerably increased.

The end zones 11 can be formed very accurately and reproducibly both as regards their dimensions and as regards their recombination rate because the ion implantation used is a readily controllable process which can be controlled accurately via implantation energy, dose and possible "anneal" parameters.

The semiconductor laser according to the invention can be manufactured, for example, by carrying out, approximately normal to the mirror faces of the finished laser structure (usually under a small deviation, in (110) mirror faces for example 7°, relative to the perpendicular direction to prevent "channeling") a bombardment with ions which cause crystal damage down to the desired depth. This is carried out preferably by means of a proton bombardment, although deuterons ($D^+$) or ionized hydrogen molecules ($H_2^+$) may also be used satisfactorily. When the ion bombardment takes place approximately at right angles to the mirror surfaces, it will often be desirable to perform the bombardment with different energies. This is to ensure that the crystal damage which yields the required high recombination rate is present over the whole length of the end zones. For example, in the embodiment described two proton bombardments, for example at 100 keV and at 50 keV, may be used each with a dose of $2 \times 10^5$ protons per $cm^2$.

The semiconductor laser shown in FIGS. 1 to 3 may be constructed, for example, from a substrate 12 of N type GaAs having a thickness of 100 μm, a doping of $10^{18}$ Si-atoms per $cm^3$ and a surface having a (100) crystal orientation. Provided thereon are successively a first passive layer 4 (N type, composition $Al_{0.4}Ga_{0.6}As$, doping $5 \times 10^{17}$ tin atoms per $cm^3$, thickness 2 μm), an active layer 3 (undoped, composition $Al_{0.09}Ga_{0.91}As$, weak N type, thickness 0.2 μm), a second passive layer 5 (P-type, composition $Al_{0.4}Ga_{0.6}As$, thickness 2 μm, doping $5 \times 10^{17}$ germanium atoms per $cm^3$), and a contact layer 13 (P-type GaAs, doping $10^{18}$ germanium atoms per $cm^3$, thickness 1 μm). In this contact layer 13 finally, a $P^+$ zinc diffusion 14 is often provided down to a depth of approximately 0.5 μm so as to obtain a satisfactory low-ohmic contact. The laser thus constructed may emit a radiation beam having a wavelength of approximately 820 nm.

The lateral boundary of the strip-shaped active region 2 was obtained in this case by a proton bombardment approximately at right angles to the major surface, in which the active region was masked, for example, by a tungsten wire. As a result of this the semiconductor layers 5 and 13 on either side of the active region 2 were made high-ohmic down to a depth of approximately 1.5 μm, that is, down to approximately 1.5 μm of the active layer 3. The high-ohmic zones 15 thus obtained are shown in FIGS. 1 and 3.

Instead of by an ion bombardment transverse to the mirror faces, it is also possible to provide the end zones 11 prior to the formation of the mirror faces, while the lasers still form part of the semiconductor wafer on which they are formed. The ion bombardment is carried out approximately at right angles to the semiconductor wafer and by means of a suitable masking and by controlling the implantation energy it is controlled so that at the area of the end zones to be formed the crystal damage extends through the active layer 3 and, in the regions on either side of the strip-shaped active regions 2, remains remote from the layer 3 preferably by approximately 1.5 μm. The semiconductor wafer is then severed into individual lasers in such manner that cleavage surfaces are formed which serve as mirror faces and bound the bombarded end zones. In that case no double bombardment at different energies is necessary to make the crystal damage in the end zones 11 homogeneous, since the layer 3 has only a very small thickness. The fact that the dimension of the end zones 11 in a direction normal to the mirror faces is only a few μm, however, makes it difficult to provide the cleavage surfaces serving as mirror faces in the correct place.

A method in which this can nevertheless be done in a comparatively simple manner will now be illustrated with reference to FIGS. 4 to 9.

The starting material is a semiconductor wafer having a layer structure suitable for the formation of semiconductor lasers. As an example the same layer structure is used here as in the example of FIGS. 1 to 3, but other layer structures may of course be used instead. In this layer structure, consisting (see FIG. 4) of the substrate 12, the passive layers 4 and 5, the active layer 3 and the contact layer 13, grooves 20 are provided before carrying out a zinc diffusion 14, at the area of the cleavage surfaces serving as mirror faces to be provided, which grooves extend down to a smaller depth than the active layer 3. In this example, mutually parallel V-shaped grooves 20 are etched at distances of approximately 250 μm from each other which extend in the (110)-direction on the (100) oriented surface of the semiconductor wafer and the walls of which are formed substantially by (111) faces. These grooves have a depth of approximately 1.5 μm. Since the thickness of the layer 13 is approximately 1 μm and that of the layer 5 is approximately 2 μm, the deepest point of the grooves 11 is at approximately 1.5 μm from the active layer 3. The grooves may be provided by means of a preferential etching process in which, for example, a radiation-sensitive lacquer layer (photolacquer layer), electron resist or the like is used as a masking and, for example, a preferential etching liquid which contains $NH_4OH$, $H_2O_2$ and water is used as an etchant. Herewith V-shaped grooves having walls which form approximately (111) faces and make an angle of approximately 54° with the (100) face are formed in a (110) plane. This way of etching makes it possible to accurately control the depth of the grooves. Differently-shaped grooves and other etching methods, for example plasma etching, may also be used provided the semiconductor wafer can be cleaved thereby in the direction of the grooves according to planes which are at right angles to the major surface.

After etching and after removing the etching mask, zinc is diffused in the upper surface and in the groove walls, so as to obtain a good ohmic contact, for example, down to a depth of approximately 0.5 μm so that a $P^+$ layer 14 is formed in the contact layer 13. In certain circumstances this zinc diffusion may be omitted, for example, when alloyed electrodes are used.

Figure 4:
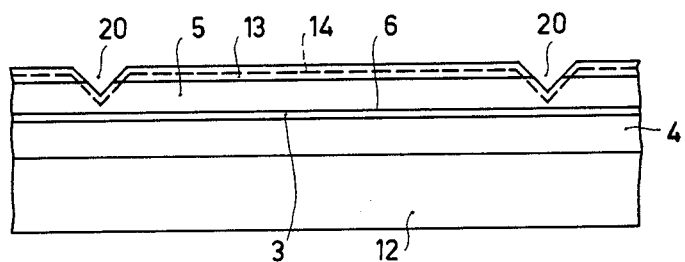
FIGS. 4 to 6, 8 and 9 are diagrammatic cross-sectional views.
Figure 5:
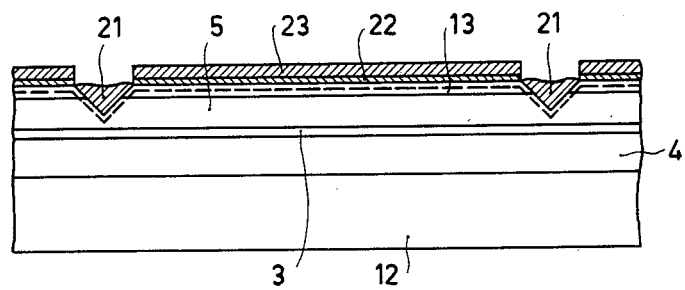
Figure 6:
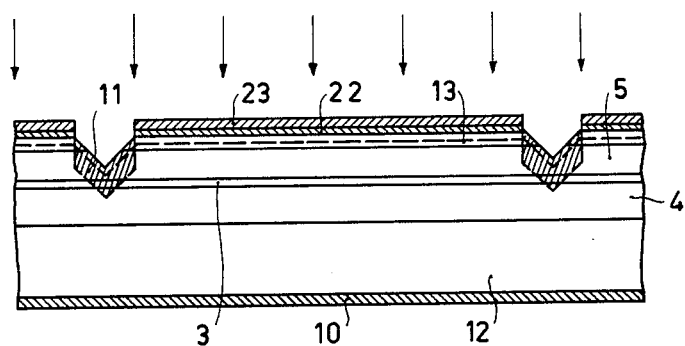

In the FIG. 4 structure obtained in this manner a 50 nm thick chromium layer and thereon a 100 nm thick platinum layer are successively sputtered on the upper surface and in the grooves. The grooves 20 are then filled with a photolacquer 21. This may be done, for example, by providing (positive) photosensitive lacquer over the whole surface and exposing said photolacquer from above down to such a depth that upon developing the photolacquer remains only in the grooves. A 1 μm thick gold layer 23 is then deposited electrolytically on the upper surface outside the grooves 20, see FIG. 5. The photolacquer 21 is then removed from the grooves 20, for example by plasma etching, after which (see FIG. 6) protons are implanted in the major surface in the direction of the arrows, thus forming implanted zones 11 (shaded in FIG. 6) with associated crystal damage which in any case extend partly through the active layer 3. In this proton implantation the gold layer 23 in combination with the underlying thinner chromium-platinum layer 22 serves as a mask.

Figure 7:
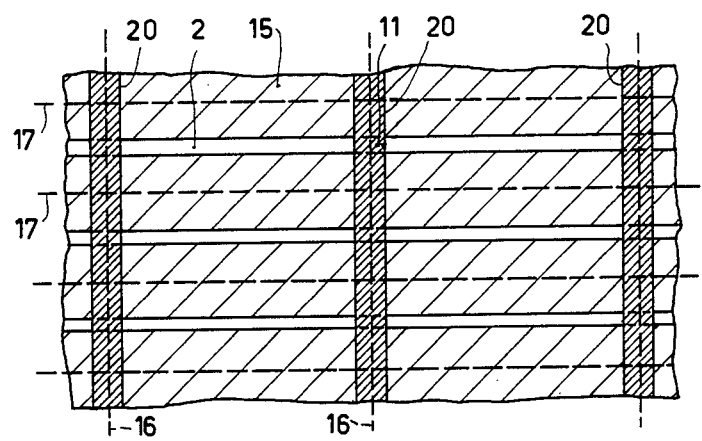
FIG. 7 is a plan view of successive stages of a method of manufacturing the semiconductor laser according to the invention.

After removing the gold layer 23, the strip-shaped active regions of the lasers are defined by a second proton bombardment to form high-ohmic zones 15 extending down to approximately 1.5 $\mu$m from the active layer in accordance with FIG. 7 which is a plan view of a part of the semiconductor wafer in this stage. As a masking in this latter proton bombardment is used as a rule a grating of metal wires, for example tungsten wires, present on or directly above the surface.

Finally, after providing the substrate on the lower side with an electrode layer, for example a gold-germanium layer 10, the semiconductor water is severed into individual lasers by scribing and breaking, in which cleavage surfaces 16 (see FIG. 7) serving as mirror surfaces 7 and 8 are obtained according to the grooves 20. Cleaving can simply be carried out by providing a diamond scribe in the end of the groove.

Figure 8:
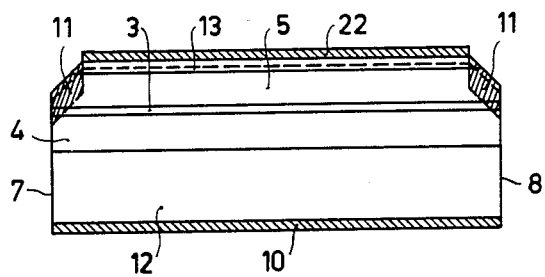
Figure 9:
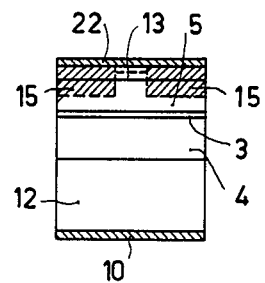

The individual lasers obtained in this manner have a cross-section which is shown diagrammatically in FIG. 8 in the longitudinal direction and in FIG. 9 in the direction of width. Characteristic is that the side faces of the crystal which form the mirror faces 7 and 8 outside the active region show facets which are formed by the walls of the originally provided V-grooves. It is to be noted that in the last-described example the zinc diffusion may also be carried out prior to etching the grooves. In order to avoid problems in the subsequent etching with a difference in etching rate between the diffused and the non-diffused contact layer parts, first the diffused layer 14 may be removed at the area of the grooves to be etched, for example, by means of an isotopic etching liquid or by means of plasma etching, after which the V-grooves are formed by means of a preferential etchant.

Figure 10A:
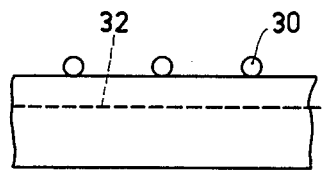
FIGS. 10A, 10B and 11A, 11B are cross-sectional views of a semiconductor wafer during the manufacture of a number of semiconductor lasers according to the invention.
Figure 11A:
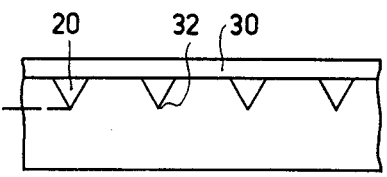
Figure 10B:
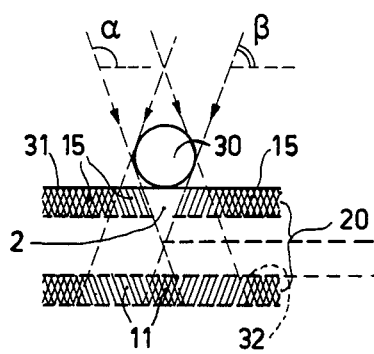
Figure 11B:
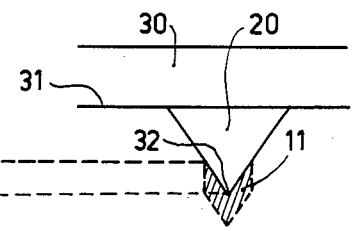

According to an important modified embodiment the implantations to form the zones 11 and 15 can be carried out by means of the same masking without removing the semiconductor wafer from the apparatus. For that purpose, a masking in the form of wires 30, for example, tungsten wires, extending transversely across the grooves, is provided after providing the grooves 20 at the area of the strip-shaped active regions 2 to be formed. See FIGS. 10A, B in a cross-sectional view along a groove and FIGS. 11A, B in a cross-section at right angles in the grooves. The ion implantation, in this example a proton bombardment, is then carried out in the form of successive (in this example two) implantations at different angles ($\alpha,\beta$) with the major surface 31. The angles $\alpha$ and $\beta$ are chosen such that the implanted regions overlap each other on and near the bottom 32 of the grooves 20 (see FIG. 10B) thus forming the zone 11 which penetrates through the active layer, but on and near the major surface 31 on either side of the wires 30 form zones 15 which are mutually separated. For reasons of clarity, the layers 3, 4 and 5 are not shown in FIGS. 10A, B and 11A, B.

Although only lasers of the double hetero junction type of the most usual structure were described in the example, the invention is by no means restricted thereto. For example, the invention is also advantageous in lasers in which the p-n junction is not parallel but at right angles to the active layer, for example, in laser structures of the so-called TJS (Transverse Junction Stripe)-type described inter alia in U.S. Pat. No. 3,961,996. In general, the invention may advantageously be used in any semiconductor laser in which non-radiating recombination near the mirror faces may occur and should be avoided.

An important advantage of the invention is that the bombarded mirror faces need not necessarily be provided with a dielectric protective layer, although a vapor-deposited dielectric protective layer can produce an even further improvement in the lifetime of the laser.

Instead of the semiconductor materials described in the examples, of course, other semiconductor materials suitable for the manufacture of p-n semiconductor lasers may be used. Within the scope of the invention other electrode structures and electrode materials may also be used, while the conductivity types given in the examples may also be replaced (simultaneously) by their opposites.

A comparison of otherwise-identical semiconductor laser structures demonstrated that in non-bombarded mirror faces, degradation and pulsations occurred after a few hours, while in bombarded mirror faces according to the invention no degradation was observable after 350 hours continuous (cw) operation at 10 mW power.

What is claimed is:

1. A semiconductor laser having a semiconductor body comprising an active laser region having a p-n junction, in which said active region is present within a resonator which is formed by two mutually parallel reflecting non-oxidized, non-metallic mirror faces, said mirror faces being formed by crystal cleavage surfaces, in which contact members are present to supply current in the forward direction to said p-n junction to generate coherent electromagnetic radiation in said active region, and in which said active region comprises end zones adjoining said mirror faces to reduce non-radiating recombination adjacent said mirror faces, characterized in that said end zones are formed by parts of said active region which comprise implanted ions with associated crystal damage and extend from said mirror faces a distance which is approximately equal to the diffusion length of recombining charge carriers in said end zones.

2. A semiconductor laser as claimed in claim 1, characterized in that said implanted ions are protons.

3. A semiconductor laser as claimed in claim 1, characterized in that said implanted ions are deuterons (D+) or singly ionized hydrogen molecules (H$_2$+).

4. A semiconductor laser as claimed in claim 2, characterized in that said end zones extend from said mirror faces up to a distance which is larger than 0.5 $\mu$m and is smaller than 5 $\mu$m.

5. A semiconductor laser as claimed in any one of the preceding claims, characterized in that said laser comprises a layer structure in which said active region is strip-shaped and forms part of an active semiconductor layer extending parallel to a major surface of said semiconductor body, the p-n junction extending parallel to said active layer.

6. A semiconductor layer as claimed in claim 5, characterized in that said strip-shaped active region in its direction of width is bounded laterally by a part of an ion-implanted region which also forms said end zones.

* * * * *